(12) United States Patent
Uchida et al.

(10) Patent No.: US 11,233,127 B2
(45) Date of Patent: Jan. 25, 2022

(54) SILICON CARBIDE SEMICONDUCTOR DEVICE

(71) Applicant: Sumitomo Electric Industries, Ltd., Osaka (JP)

(72) Inventors: Kosuke Uchida, Osaka (JP); Toru Hiyoshi, Osaka (JP)

(\*) Notice: Subject to any disclaimer, the term of this patent is extended or adjusted under 35 U.S.C. 154(b) by 0 days.

(21) Appl. No.: 16/961,030

(22) PCT Filed: Oct. 2, 2018

(86) PCT No.: PCT/JP2018/036900
§ 371 (c)(1),
(2) Date: Jul. 9, 2020

(87) PCT Pub. No.: WO2019/142406
PCT Pub. Date: Jul. 25, 2019

(65) Prior Publication Data
US 2020/0373393 A1    Nov. 26, 2020

(30) Foreign Application Priority Data
Jan. 22, 2018  (JP) .............................. JP2018-008374

(51) Int. Cl.
  *H01L 29/16*     (2006.01)
  *H01L 29/423*    (2006.01)
  *H01L 29/78*     (2006.01)

(52) U.S. Cl.
  CPC ...... *H01L 29/1608* (2013.01); *H01L 29/4236* (2013.01); *H01L 29/7813* (2013.01)

(58) Field of Classification Search
  CPC ............. H01L 29/1608; H01L 29/4236; H01L 29/7813
(Continued)

(56) References Cited

U.S. PATENT DOCUMENTS 6,037,632 A      3/2000  Omura et al.
6,541,804 B2 *   4/2003  Tihanyi ............... H01L 29/0634
                                                          257/213
(Continued)

FOREIGN PATENT DOCUMENTS

JP    H09-191109 A    7/1997
JP    2008-066473 A   3/2008
(Continued)

*Primary Examiner* — Igwe U Anya
(74) *Attorney, Agent, or Firm* — Baker Botts L.L.P.; Michael A. Sartori

(57) ABSTRACT

A silicon carbide substrate has a first main surface and a second main surface opposite to the first main surface. A gate pad faces the first main surface. A drain electrode is in contact with the second main surface. The silicon carbide substrate includes a first impurity region constituting the second main surface and having a first conductivity type, a second impurity region provided on the first impurity region and having a second conductivity type different from the first conductivity type, a third impurity region provided on the second impurity region and having the first conductivity type, and a fourth impurity region provided on the third impurity region, constituting the first main surface, and having the second conductivity type. Each of the first impurity region, the second impurity region, the third impurity region, and the fourth impurity region is located between the gate pad and the drain electrode.

13 Claims, 4 Drawing Sheets

(58) Field of Classification Search
USPC .......................................................... 257/77
See application file for complete search history.

(56) References Cited

U.S. PATENT DOCUMENTS

| | | | |
|---|---|---|---|
| 7,135,739 B2* | 11/2006 | Ohtani ................ | H01L 29/7802 |
| | | | 257/329 |
| 2014/0191248 A1 | 7/2014 | Takaya et al. | |
| 2017/0278924 A1* | 9/2017 | Bolotnikov ............. | H01L 29/73 |
| 2019/0081170 A1* | 3/2019 | Kumagai ............ | H01L 29/7806 |
| 2020/0194546 A1* | 6/2020 | Arthur ............. | H01L 29/66712 |

FOREIGN PATENT DOCUMENTS

| JP | 2014-017326 A | 1/2014 |
|---|---|---|
| JP | 2014-135367 A | 7/2014 |
| JP | 2017-011031 A | 1/2017 |

* cited by examiner

SILICON CARBIDE SEMICONDUCTOR DEVICE

TECHNICAL FIELD

The present disclosure relates to a silicon carbide semiconductor device. The present application claims priority to Japanese Patent Application No. 2018-008374 filed on Jan. 22, 2018, the entire contents of which are incorporated herein by reference.

BACKGROUND ART

Japanese Patent Laying-Open No. 2017-11031 (PTL 1) discloses a trench-type metal oxide semiconductor field effect transistor (MOSFET) having a gate trench provided in a main surface of a silicon carbide substrate.

CITATION LIST

Patent Literature

PTL 1: Japanese Patent Laying-Open No. 2017-11031

SUMMARY OF INVENTION

A silicon carbide semiconductor device in accordance with the present disclosure includes a silicon carbide substrate, a gate pad, and a drain electrode. The silicon carbide substrate has a first main surface and a second main surface opposite to the first main surface. The gate pad faces the first main surface. The drain electrode is in contact with the second main surface. The silicon carbide substrate includes a first impurity region constituting the second main surface and having a first conductivity type, a second impurity region provided on the first impurity region and having a second conductivity type different from the first conductivity type, a third impurity region provided on the second impurity region and having the first conductivity type, and a fourth impurity region provided on the third impurity region, constituting the first main surface, and having the second conductivity type. Each of the first impurity region, the second impurity region, the third impurity region, and the fourth impurity region is located between the gate pad and the drain electrode.

A silicon carbide semiconductor device in accordance with the present disclosure includes a silicon carbide substrate, a gate pad, a drain electrode, and a source electrode. The silicon carbide substrate has a first main surface and a second main surface opposite to the first main surface. The gate pad faces the first main surface. The drain electrode is in contact with the second main surface. The source electrode is located on the first main surface. The silicon carbide substrate includes a first impurity region constituting the second main surface and having a first conductivity type, a second impurity region provided on the first impurity region and having a second conductivity type different from the first conductivity type, a third impurity region provided on the second impurity region and having the first conductivity type, and a fourth impurity region provided on the third impurity region, constituting the first main surface, and having the second conductivity type. Each of the first impurity region, the second impurity region, the third impurity region, and the fourth impurity region is located between the gate pad and the drain electrode. The second impurity region is electrically connected with the source electrode. When viewed from a direction perpendicular to the first main surface, an area of each of the second impurity region and the fourth impurity region is more than or equal to an area of the gate pad.

DETAILED DESCRIPTION

Figure 1:
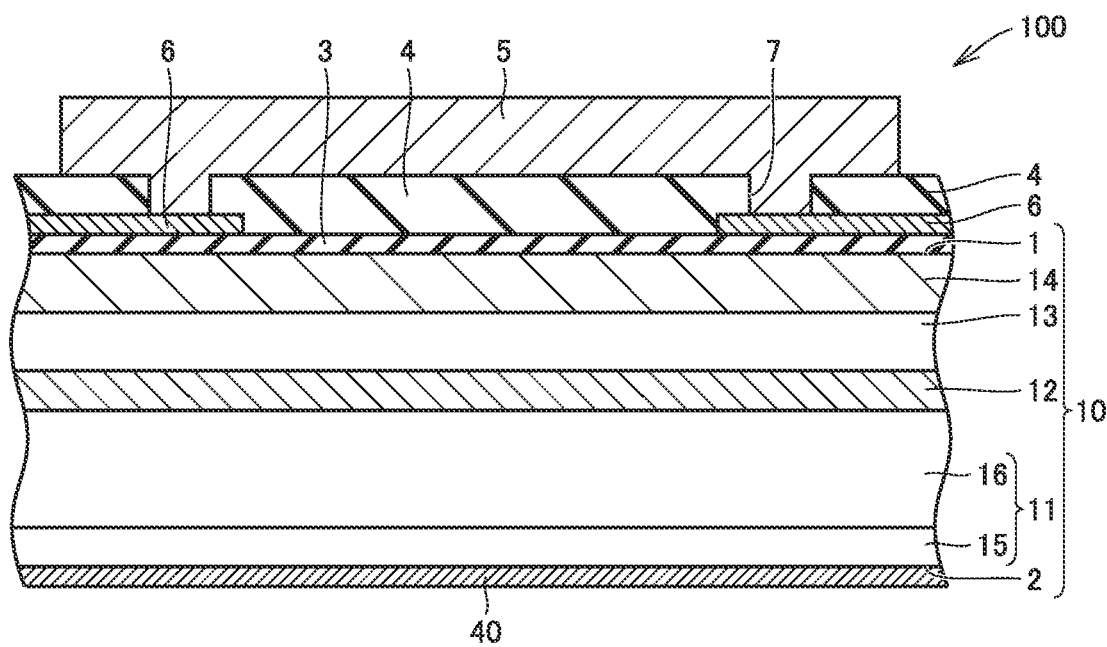
FIG. 1 is a schematic cross sectional view taken along a line I-I in FIG. 3 and viewed in the direction of arrows.

Summary of Embodiment of the Present Disclosure

First, a summary of an embodiment of the present disclosure will be described.

(1) A silicon carbide semiconductor device 100 in accordance with the present disclosure includes a silicon carbide substrate 10, a gate pad 5, and a drain electrode 40. Silicon carbide substrate 10 has a first main surface 1 and a second main surface 2 opposite to first main surface 1. Gate pad 5 faces first main surface 1. Drain electrode 40 is in contact with second main surface 2. Silicon carbide substrate 10 includes a first impurity region 11 constituting second main surface 2 and having a first conductivity type, a second impurity region 12 provided on first impurity region 11 and having a second conductivity type different from the first conductivity type, a third impurity region 13 provided on second impurity region 12 and having the first conductivity type, and a fourth impurity region 14 provided on third impurity region 13, constituting first main surface 1, and having the second conductivity type. Each of first impurity region 11, second impurity region 12, third impurity region 13, and fourth impurity region 14 is located between gate pad 5 and drain electrode 40.

(2) Silicon carbide semiconductor device 100 in accordance with (1) described above may further include a source electrode 36 located on first main surface 1. Second impurity region 12 may be electrically connected with source electrode 36.

(3) In silicon carbide semiconductor device 100 in accordance with (1) or (2) described above, second impurity region 12 may have an impurity concentration of more than or equal to $1 \times 10^{17}$ cm$^{-3}$ and less than or equal to $1 \times 10^{20}$ cm$^{-3}$.

(4) In silicon carbide semiconductor device 100 in accordance with any of (1) to (3) described above, second impurity region 12 may have a thickness of more than or equal to 100 nm and less than or equal to 2 μm.

(5) In silicon carbide semiconductor device 100 in accordance with any of (1) to (4) described above, fourth impurity region 14 may have an impurity concentration of more than or equal to $1 \times 10^{16}$ cm$^{-3}$ and less than or equal to $1 \times 10^{20}$ cm$^{-3}$.

(6) In silicon carbide semiconductor device 100 in accordance with any of (1) to (5) described above, fourth impurity region 14 may have a thickness of more than or equal to 100 nm and less than or equal to 2 μm.

(7) In silicon carbide semiconductor device 100 in accordance with any of (1) to (6) described above, when viewed from a direction perpendicular to first main surface 1, an area of second impurity region 12 may be more than or equal to an area of gate pad 5.

(8) In silicon carbide semiconductor device 100 in accordance with any of (1) to (7) described above, when viewed from a direction perpendicular to first main surface 1, an area of fourth impurity region 14 may be more than or equal to an area of gate pad 5.

(9) Silicon carbide semiconductor device 100 in accordance with the present disclosure includes silicon carbide substrate 10, gate pad 5, drain electrode 40, and source electrode 36. Silicon carbide substrate 10 has first main surface 1 and second main surface 2 opposite to first main surface 1. Gate pad 5 faces first main surface 1. Drain electrode 40 is in contact with second main surface 2. Source electrode 36 is located on first main surface 1. Silicon carbide substrate 10 includes first impurity region 11 constituting second main surface 2 and having a first conductivity type, second impurity region 12 provided on first impurity region 11 and having a second conductivity type different from the first conductivity type, third impurity region 13 provided on second impurity region 12 and having the first conductivity type, and fourth impurity region 14 provided on third impurity region 13, constituting first main surface 1, and having the second conductivity type. Each of first impurity region 11, second impurity region 12, third impurity region 13, and fourth impurity region 14 is located between gate pad 5 and drain electrode 40. Second impurity region 12 is electrically connected with source electrode 36. When viewed from a direction perpendicular to first main surface 1, an area of each of second impurity region 12 and fourth impurity region 14 is more than or equal to an area of gate pad 5.

(10) In silicon carbide semiconductor device 100 in accordance with (9) described above, second impurity region 12 may have an impurity concentration of more than or equal to $1 \times 10^{17}$ cm$^{-3}$ and less than or equal to $1 \times 10^{20}$ cm$^{-3}$.

(11) In silicon carbide semiconductor device 100 in accordance with (9) or (10) described above, second impurity region 12 may have a thickness of more than or equal to 100 nm and less than or equal to 2 μm.

(12) In silicon carbide semiconductor device 100 in accordance with any of (9) to (11) described above, fourth impurity region 14 may have an impurity concentration of more than or equal to $1 \times 10^{16}$ cm$^{-3}$ and less than or equal to $1 \times 10^{20}$ cm$^{-3}$.

(13) In silicon carbide semiconductor device 100 in accordance with any of (9) to (12) described above, fourth impurity region 14 may have a thickness of more than or equal to 100 nm and less than or equal to 2 μm.

Details of Embodiment of the Present Disclosure

Hereinafter, an embodiment will be described based on the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, an individual plane is represented by ( ) and a group plane is represented by { }. Generally, a negative index is supposed to be crystallographically indicated by putting "-" (bar) above a numeral, but is indicated by putting the negative sign before the numeral in the present specification.

First, a configuration of a MOSFET 100 as an example of silicon carbide semiconductor device 100 in accordance with the present embodiment will be described.

Figure 2:
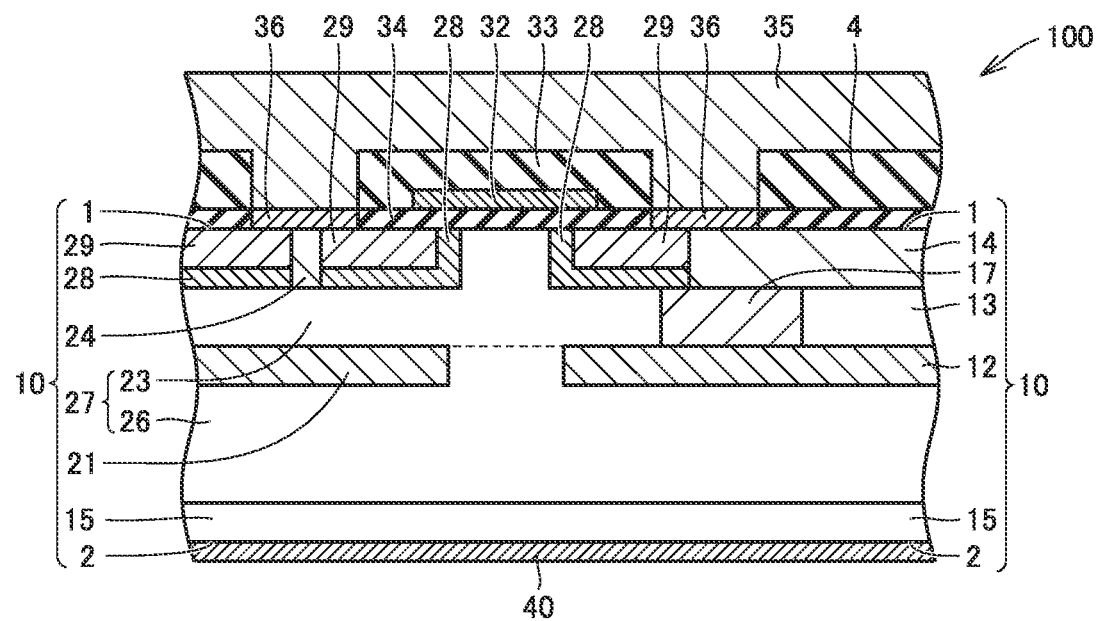
FIG. 2 is a schematic cross sectional view taken along a line II-II in FIG. 3 and viewed in the direction of arrows.

As shown in FIGS. 1 and 2, MOSFET 100 in accordance with the present embodiment mainly has silicon carbide substrate 10, gate pad 5, drain electrode 40, a gate connection portion 6, a first insulating film 3, a first interlayer insulating film 4, a second interlayer insulating film 33, a gate electrode 32, a gate insulating film 34, source electrode 36, and a source interconnection 35. Silicon carbide substrate 10 has first main surface 1 and second main surface 2 opposite to first main surface 1. Silicon carbide substrate 10 is made of hexagonal silicon carbide having a polytype of 4H, for example.

First main surface 1 is a {0001} plane, or a plane inclined at an off angle of less than or equal to 8° in an off direction relative to the {0001} plane. For example, first main surface 1 is a (0001) plane, or a plane inclined at an off angle of less than or equal to 8° in an off direction relative to the (0001) plane. Alternatively, first main surface 1 may be a (000-1) plane, or a plane inclined at an off angle of less than or equal to 8° in an off direction relative to the (000-1) plane. The off direction may be a <11-20> direction, or may be a <1-100> direction, for example. The off angle may be more than or equal to 1°, or may be more than or equal to 2°, for example. The off angle may be less than or equal to 6°, or may be less than or equal to 4°.

As shown in FIG. 1, silicon carbide substrate 10 includes first impurity region 11, second impurity region 12, third impurity region 13, and fourth impurity region 14. First impurity region 11 includes an n type impurity such as nitrogen (N), for example, and has n type (a first conductivity type). First impurity region 11 constitutes second main surface 2. First impurity region 11 has a silicon carbide single crystal substrate 15 and a silicon carbide layer 16. Silicon carbide layer 16 is provided on silicon carbide single crystal substrate 15. Silicon carbide single crystal substrate 15 constitutes second main surface 2. The concentration of the n type impurity included in silicon carbide layer 16 may be lower than the concentration of the n type impurity included in silicon carbide single crystal substrate 15. Silicon carbide layer 16 is in contact with second impurity region 12.

Second impurity region 12 is provided on first impurity region 11. Second impurity region 12 includes a p type impurity such as aluminum (Al), for example, and has a p type conductivity type (a second conductivity type). The concentration of the p type impurity in second impurity region 12 is more than or equal to $1 \times 10^{17}$ cm$^{-3}$ and less than or equal to $1 \times 10^{20}$ cm$^{-3}$, for example. The lower limit of the concentration of the p type impurity in second impurity region 12 is not particularly limited, and may be more than or equal to $1 \times 10^{17}$ cm$^{-3}$, or may be more than or equal to $5 \times 10^{17}$ cm$^{-3}$, for example. The upper limit of the concentration of the p type impurity in second impurity region 12 is not particularly limited, and may be less than or equal to $1 \times 10^{19}$ cm$^{-3}$, or may be less than or equal to $5 \times 10^{18}$ cm$^{-3}$, for example.

Second impurity region 12 has a thickness of more than or equal to 100 nm and less than or equal to 2 µm, for example. The lower limit of the thickness of second impurity region 12 is not particularly limited, and may be more than or equal to 0.5 µm, or may be more than or equal to 0.8 µm, for example. The upper limit of the thickness of second impurity region 12 is not particularly limited, and may be less than or equal to 1.5 µm, or may be less than or equal to 1.2 µm, for example.

Third impurity region 13 is provided on second impurity region 12. Third impurity region 13 is provided between second impurity region 12 and fourth impurity region 14. Third impurity region 13 is in contact with each of second impurity region 12 and fourth impurity region 14. Third impurity region 13 includes an n type impurity such as nitrogen, for example, and has an n type conductivity type. The concentration of the n type impurity in third impurity region 13 may be the same as or different from the concentration of the n type impurity in silicon carbide layer 16.

Fourth impurity region 14 is provided on third impurity region 13. Fourth impurity region 14 includes a p type impurity such as aluminum, for example, and has p type. Fourth impurity region 14 constitutes first main surface 1. Fourth impurity region 14 has an impurity concentration of more than or equal to $1 \times 10^{16}$ cm$^{-3}$ and less than or equal to $1 \times 10^{20}$ cm$^{-3}$, for example. The lower limit of the concentration of the p type impurity in fourth impurity region 14 is not particularly limited, and may be more than or equal to $1 \times 10^{17}$ cm$^{-3}$, or may be more than or equal to $5 \times 10^{17}$ cm$^{-3}$, for example. The upper limit of the concentration of the p type impurity in fourth impurity region 14 is not particularly limited, and may be less than or equal to $1 \times 10^{19}$ cm$^{-3}$, or may be less than or equal to $5 \times 10^{18}$ cm$^{-3}$, for example.

Fourth impurity region 14 has a thickness of more than or equal to 100 nm and less than or equal to 2 µm, for example. The lower limit of the thickness of fourth impurity region 14 is not particularly limited, and may be more than or equal to 0.5 µm, or may be more than or equal to 0.8 µm, for example. The upper limit of the thickness of fourth impurity region 14 is not particularly limited, and may be less than or equal to 1.5 µm, or may be less than or equal to 1.2 µm, for example.

First insulating film 3 is provided on first main surface 1. First insulating film 3 is in contact with fourth impurity region 14 at first main surface 1. First insulating film 3 is made of a material including silicon dioxide, for example. First insulating film 3 may be continuous to gate insulating film 34. Gate connection portion 6 is provided on first insulating film 3. Gate connection portion 6 is in contact with first insulating film 3. Gate connection portion 6 is made of polysilicon including a conductive impurity, for example.

First interlayer insulating film 4 is provided on first insulating film 3. First interlayer insulating film 4 is in contact with each of first insulating film 3 and gate connection portion 6. A portion of first interlayer insulating film 4 may extend onto an upper surface of gate connection portion 6. First interlayer insulating film 4 is made of a material including silicon dioxide, for example. First interlayer insulating film 4 is provided with a through hole 7. A portion of the upper surface of gate connection portion 6 is exposed from first interlayer insulating film 4 at through hole 7.

Gate pad 5 is provided on first interlayer insulating film 4. A portion of gate pad 5 is provided within through hole 7. Gate pad 5 may be in contact with gate connection portion 6 at a lower opening of through hole 7. Gate pad 5 is made of a material including aluminum, for example. The electric resistance of the material constituting gate pad 5 may be lower than the electric resistance of the material constituting gate connection portion 6. Gate pad 5 faces first main surface 1. First interlayer insulating film 4, gate connection portion 6, and first insulating film 3 are provided between gate pad 5 and first main surface 1. A wire (not shown) for applying a gate voltage, for example, is connected to gate pad 5.

Drain electrode 40 is in contact with second main surface 2. Drain electrode 40 is in contact with silicon carbide single crystal substrate 15 at second main surface 2. Drain electrode 40 is electrically connected with first impurity region 11. Drain electrode 40 is made of a material including NiSi or TiAlSi, for example.

Each of first impurity region 11, second impurity region 12, third impurity region 13, and fourth impurity region 14 is located between gate pad 5 and drain electrode 40. Similarly, each of first impurity region 11, second impurity region 12, third impurity region 13, and fourth impurity region 14 may be located between first interlayer insulating film 4 and drain electrode 40. Each of first impurity region 11, second impurity region 12, third impurity region 13, and fourth impurity region 14 may be located between first insulating film 3 and drain electrode 40. Each of first impurity region 11, second impurity region 12, third impurity region 13, and fourth impurity region 14 may intersect with a direction in which through hole 7 extends (the up/down direction in FIG. 1).

As shown in FIG. 2, silicon carbide substrate 10 may have a drift region 27, a body region 28, a source region 29, a contact region 24, a connection region 17, and an embedded region 21. Drift region 27 includes an n type impurity such as nitrogen, for example, and has the n type conductivity type. Drift region 27 has a first drift layer 26 and a second drift layer 23, for example. First drift layer 26 is continuous to silicon carbide layer 16. The concentration of the n type impurity in first drift layer 26 may be the same as the concentration of the n type impurity in silicon carbide layer 16. Similarly, second drift layer 23 is continuous to third impurity region 13. The concentration of the n type impurity in second drift layer 23 may be the same as the concentration of the n type impurity in third impurity region 13. The concentration of the n type impurity in first drift layer 26 may be the same as or different from the concentration of the n type impurity in second drift layer 23. Drift region 27 may constitute a portion of first main surface 1.

Body region 28 is provided on drift region 27. Body region 28 is in contact with drift region 27. Body region 28 includes a p type impurity such as aluminum, for example, and has the p type conductivity type. The concentration of the p type impurity in body region 28 may be higher than the concentration of the n type impurity in drift region 27. Body region 28 may constitute a portion of first main surface 1.

The concentration of the p type impurity in body region 28 may be lower than the concentration of the p type impurity in fourth impurity region 14.

Source region 29 is provided on body region 28. Source region 29 is separated from drift region 27 by body region 28. Source region 29 includes an n type impurity such as nitrogen or phosphorus (P), for example, and has the n type conductivity type. Source region 29 constitutes a portion of first main surface 1. The concentration of the n type impurity in source region 29 may be higher than the concentration of the p type impurity in body region 28. The concentration of the n type impurity in source region 29 is about $1 \times 10^{19}$ cm$^{-3}$, for example.

Contact region 24 constitutes a portion of first main surface 1. Contact region 24 includes a p type impurity such as aluminum, for example, and has the p type conductivity type. Contact region 24 penetrates each of source region 29 and body region 28, and is in contact with drift region 27. Contact region 24 is in contact with each of source region 29 and body region 28. The concentration of the p type impurity in contact region 24 is higher than the concentration of the p type impurity in body region 28, for example. The concentration of the p type impurity in contact region 24 is more than or equal to $1 \times 10^{18}$ cm$^{-3}$ and less than or equal to $1 \times 10^{20}$ cm$^{-3}$, for example.

The concentration of the p type impurity in contact region 24 may be the same as the concentration of the p type impurity in fourth impurity region 14. Fourth impurity region 14 may be in contact with each of source region 29 and body region 28. Fourth impurity region 14 may be in contact with source electrode 36 at first main surface 1.

Embedded region 21 is provided within an active region. Embedded region 21 includes a p type impurity such as aluminum, for example, and has the p type conductivity type. Embedded region 21 is in contact with drift region 27. Embedded region 21 is electrically connected with second impurity region 12, for example. Embedded region 21 faces body region 28, source region 29, and contact region 24, for example. Embedded region 21 may face a portion of gate electrode 32. Providing embedded region 21 within the active region can suppress a reduction in breakdown voltage due to the concentration of an electric field at an end portion of second impurity region 12.

Connection region 17 is provided between second impurity region 12 and fourth impurity region 14. Connection region 17 includes a p type impurity such as aluminum, for example, and has the p type conductivity type. Connection region 17 electrically connects second impurity region 12 and fourth impurity region 14. Connection region 17 is in contact with each of third impurity region 13 and drift region 27. Connection region 17 may be in contact with body region 28. Connection region 17 may face source electrode 36.

Gate insulating film 34 is provided on first main surface 1, for example. Gate insulating film 34 is in contact with each of drift region 27, body region 28, and source region 29 at first main surface 1, for example. Gate insulating film 34 is made of a material including silicon dioxide, for example.

Gate electrode 32 is provided on gate insulating film 34. Gate electrode 32 is made of polysilicon including a conductive impurity, for example. Gate electrode 32 faces each of source region 29, body region 28, and drift region 27. Gate electrode 32 is continuous to gate connection portion 6, for example. The material constituting gate electrode 32 may be the same as the material constituting gate connection portion 6.

Source electrode 36 is provided on first main surface 1. Source electrode 36 is electrically connected with source region 29. Source electrode 36 may be in contact with source region 29 and contact region 24 at first main surface 1. Source electrode 36 is made of a material including Ti, Al, and Si, for example. Source electrode 36 forms an ohmic junction with source region 29. Source electrode 36 may form an ohmic junction with contact region 24. Source electrode 36 may be in contact with gate insulating film 34.

Second interlayer insulating film 33 covers gate electrode 32. Second interlayer insulating film 33 is in contact with each of gate electrode 32 and gate insulating film 34. Second interlayer insulating film 33 is made of a material including silicon dioxide, for example. Second interlayer insulating film 33 may face each of source region 29, body region 28, and drift region 27.

Source interconnection 35 is connected to source electrode 36. Source interconnection 35 covers each of source electrode 36 and second interlayer insulating film 33. Source interconnection 35 is made of a material including aluminum, for example. Source interconnection 35 is in contact with second interlayer insulating film 33. Source interconnection 35 is separated from gate electrode 32 by second interlayer insulating film 33.

Figure 3:
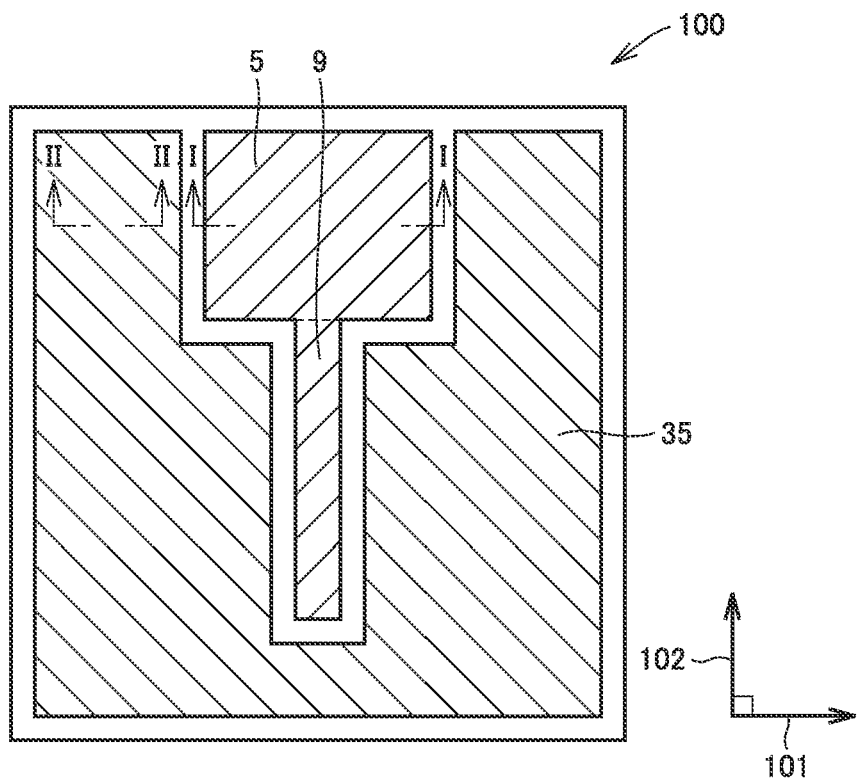
FIG. 3 is a schematic plan view showing a configuration of a silicon carbide semiconductor device in accordance with the present embodiment.

As shown in FIG. 3, when viewed from a direction perpendicular to first main surface 1, gate pad 5 has a rectangular shape, for example. MOSFET 100 may have a gate runner 9 that is continuous to gate pad 5. Gate runner 9 is made of the same material as that for gate pad 5, for example. Gate runner 9 extends along each of a first direction 101 and a second direction 102, for example. First direction 101 is the <11-20> direction, for example. Second direction 102 is a direction parallel to first main surface 1 and perpendicular to first direction 101. Second direction 102 is the <1-100> direction, for example. The length of gate runner 9 along first direction 101 may be smaller than the length of gate runner 9 along second direction 102.

As shown in FIG. 3, when viewed from the direction perpendicular to first main surface 1, the length of gate runner 9 along first direction 101 may be smaller than the length of gate pad 5 along first direction 101. Similarly, the length of gate runner 9 along second direction 102 may be larger than the length of gate pad 5 along second direction 102. Source interconnection 35 may be provided on both sides of gate pad 5 in first direction 101. Gate pad 5 is provided between source interconnection 35. Similarly, source interconnection 35 may be provided on both sides of gate runner 9 in first direction 101. When viewed from the direction perpendicular to first main surface 1, the area of gate pad 5 may be smaller than the area of source interconnection 35.

When viewed from the direction perpendicular to first main surface 1, the sum of the area of gate pad 5 and the area of gate runner 9 (a first area) may be smaller than the area of source interconnection 35 (a second area). The value obtained by dividing the first area by the sum of the first area and the second area may be less than or equal to 0.4, or less than or equal to 0.3.

Figure 4:
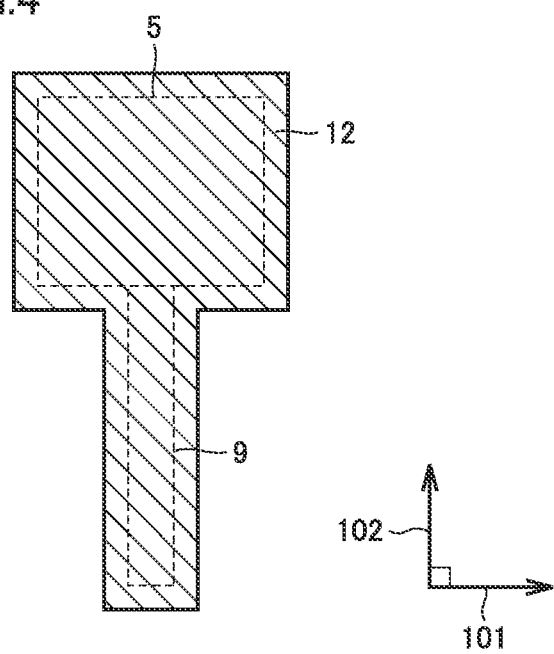
FIG. 4 is a schematic plan view showing a positional relation between a second impurity region and a gate pad.

As shown in FIG. 4, when viewed from the direction perpendicular to first main surface 1, the area of second impurity region 12 may be more than or equal to the area of gate pad 5. When viewed from the direction perpendicular to first main surface 1, gate pad 5 overlaps with second impurity region 12. When viewed from the direction perpendicular to first main surface 1, the outer edge of second impurity region 12 may surround the outer edge of gate pad 5.

Similarly, when viewed from the direction perpendicular to first main surface 1, the area of second impurity region 12 may be more than or equal to the area of gate runner 9. When viewed from the direction perpendicular to first main surface 1, gate runner 9 overlaps with second impurity region 12. When viewed from the direction perpendicular to first main surface 1, the outer edge of second impurity region 12 may surround the outer edge of gate runner 9. When viewed from the direction perpendicular to first main surface 1, the area of second impurity region 12 may be more than or equal to the sum of the area of gate pad 5 and the area of gate runner 9.

Figure 5:
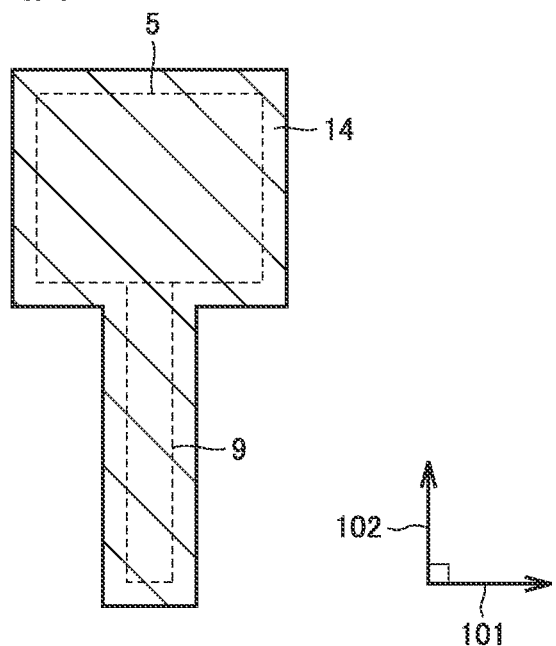
FIG. 5 is a schematic plan view showing a positional relation between a fourth impurity region and the gate pad.

As shown in FIG. 5, when viewed from the direction perpendicular to first main surface 1, the area of fourth impurity region 14 may be more than or equal to the area of gate pad 5. When viewed from the direction perpendicular to first main surface 1, gate pad 5 overlaps with fourth impurity region 14. When viewed from the direction perpendicular to first main surface 1, the outer edge of fourth impurity region 14 may surround the outer edge of gate pad 5.

Similarly, when viewed from the direction perpendicular to first main surface 1, the area of fourth impurity region 14 may be more than or equal to the area of gate runner 9. When viewed from the direction perpendicular to first main surface 1, gate runner 9 overlaps with fourth impurity region 14. When viewed from the direction perpendicular to first main surface 1, the outer edge of fourth impurity region 14 may surround the outer edge of gate runner 9. When viewed from the direction perpendicular to first main surface 1, the area of fourth impurity region 14 may be more than or equal to the sum of the area of gate pad 5 and the area of gate runner 9.

It should be noted that, although the above description has been given of a case where the area of each of second impurity region 12 and fourth impurity region 14 is more than or equal to the area of gate pad 5, the area of second impurity region 12 may be less than the area of gate pad 5 when viewed from the direction perpendicular to first main surface 1. Similarly, the area of fourth impurity region 14 may be less than the area of gate pad 5 when viewed from the direction perpendicular to first main surface 1.

Next, a method for manufacturing MOSFET 100 in accordance with the present embodiment will be described.

Figure 6:
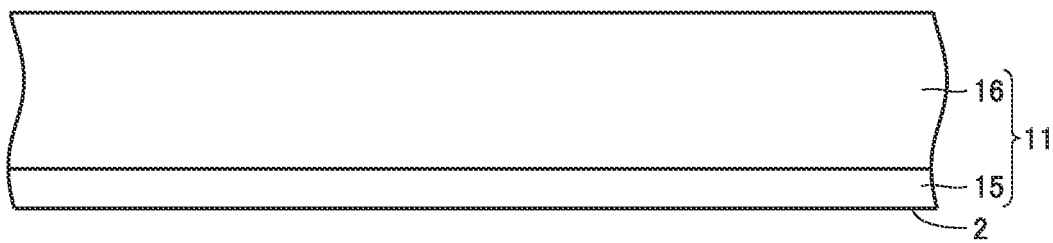
FIG. 6 is a schematic cross sectional view showing a first step of a method for manufacturing the silicon carbide semiconductor device in accordance with the present embodiment.

First, the step of forming the first impurity region is performed. Silicon carbide single crystal substrate 15 is prepared by slicing a silicon carbide ingot (not shown) manufactured by a sublimation method, for example. Then, the step of forming the silicon carbide layer is performed. Silicon carbide layer 16 is formed on silicon carbide single crystal substrate 15 (see FIG. 6) by a chemical vapor deposition (CVD) method that uses a mixed gas of silane ($SiH_4$) and propane ($C_3H_8$), for example, as a source gas, and uses hydrogen ($H_2$), for example, as a carrier gas. Silicon carbide single crystal substrate 15 and silicon carbide layer 16 constitute first impurity region 11. During epitaxial growth, an n type impurity such as nitrogen, for example, is introduced into silicon carbide layer 16. Silicon carbide layer 16 has the n type conductivity type. Simultaneously with the formation of silicon carbide layer 16, first drift layer 26 (see FIG. 2) is formed on silicon carbide single crystal substrate 15.

Figure 7:
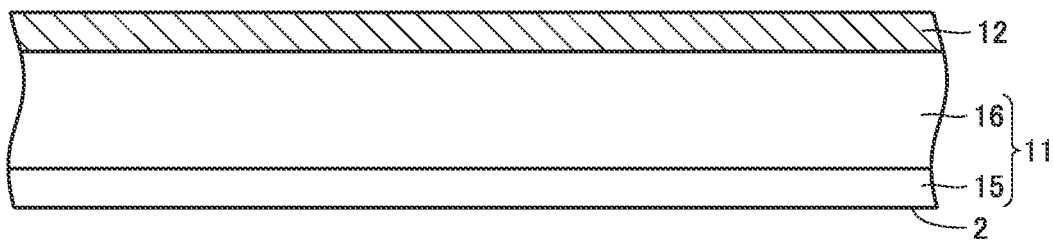
FIG. 7 is a schematic cross sectional view showing a second step of the method for manufacturing the silicon carbide semiconductor device in accordance with the present embodiment.

Then, the step of forming the second impurity region is performed. A mask layer (not shown) having an opening above a region in which second impurity region 12 is to be formed, for example, is formed. Then, a p type impurity such as aluminum, for example, is implanted into first impurity region 11. Thereby, second impurity region 12 is formed (see FIG. 7). Second impurity region 12 is formed to be in contact with first impurity region 11 and to be exposed at a surface of first impurity region 11.

Figure 8:
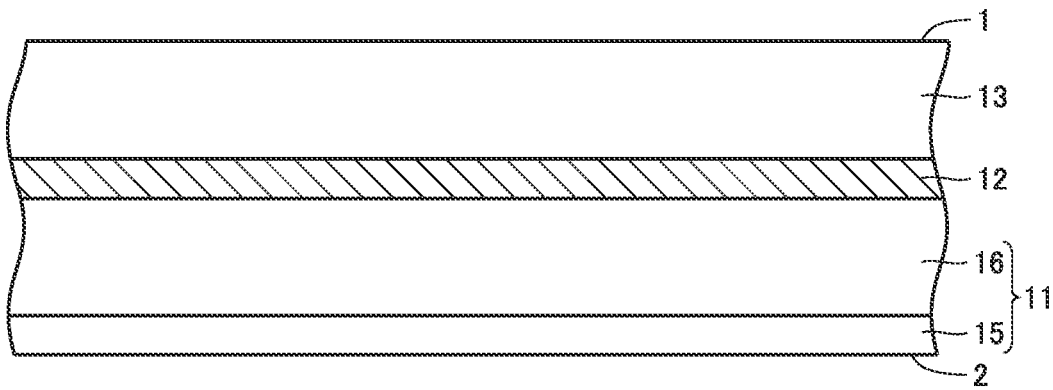
FIG. 8 is a schematic cross sectional view showing a third step of the method for manufacturing the silicon carbide semiconductor device in accordance with the present embodiment.

Then, the step of forming the third impurity region is performed. Third impurity region 13 is formed on second impurity region 12 (see FIG. 8) by the CVD method that uses a mixed gas of silane and propane, for example, as a source gas, and uses hydrogen, for example, as a carrier gas. During epitaxial growth, an n type impurity such as nitrogen, for example, is introduced into third impurity region 13. Third impurity region 13 has the n type conductivity type. Simultaneously with the formation of third impurity region 13, second drift layer 23 is formed on first drift layer 26. Then, connection region 17 (see FIG. 2) in contact with the third impurity region may be formed.

Then, the step of forming the body region is performed. A mask layer (not shown) having an opening above a region in which body region 28 is to be formed, for example, is formed. Then, a p type impurity such as aluminum, for example, is implanted into second drift layer 23. Thereby, body region 28 (see FIG. 2) in contact with second drift layer 23 is formed.

Then, the step of forming the source region is performed. A mask layer (not shown) having an opening above a region in which source region 29 is to be formed, for example, is formed. Then, an n type impurity such as phosphorus (P), for example, is implanted into body region 28. Thereby, source region 29 is formed. Source region 29 is formed to be in contact with body region 28 and to be exposed at first main surface 1.

Figure 9:
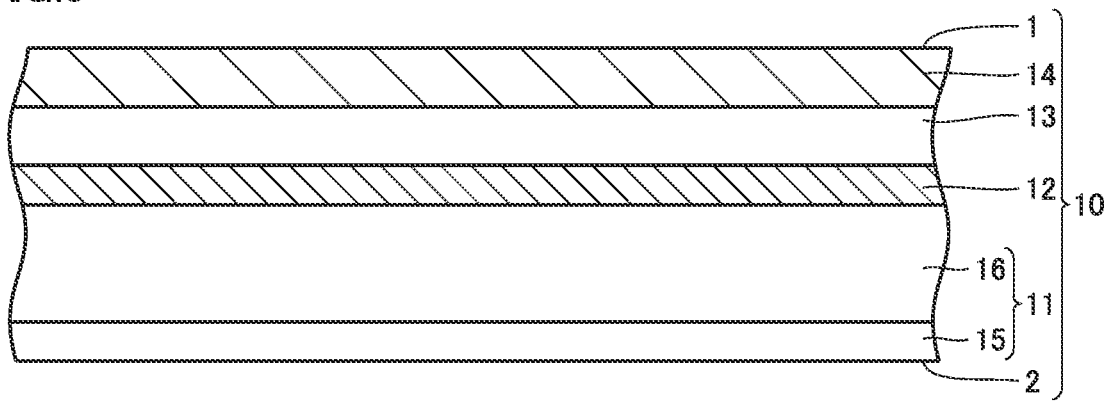
FIG. 9 is a schematic cross sectional view showing a fourth step of the method for manufacturing the silicon carbide semiconductor device in accordance with the present embodiment.

Then, the step of forming the fourth impurity region is performed. A mask layer (not shown) having an opening above a region in which fourth impurity region 14 is to be formed, for example, is formed. Then, a p type impurity such as aluminum, for example, is implanted into fourth impurity region 14. Thereby, fourth impurity region 14 in contact with third impurity region 13 is formed (see FIG. 9). It should be noted that fourth impurity region 14 may be formed to be in contact with connection region 17. Fourth impurity region 14 constitutes first main surface 1. Simultaneously with the formation of fourth impurity region 14, contact region 24 (see FIG. 2) in contact with each of source region 29 and body region 28 is formed.

Then, activation annealing is performed to activate impurity ions implanted into silicon carbide substrate 10. The temperature for activation annealing is preferably more than or equal to 1500° C. and less than or equal to 1900° C., and is about 1700° C., for example. The time for activation annealing is about 30 minutes, for example. The atmosphere for activation annealing is preferably an inert gas atmosphere, and is an Ar atmosphere, for example.

Then, the step of forming the first insulating film and the gate insulating film is performed. First insulating film 3 and gate insulating film 34 are formed by thermally oxidizing silicon carbide substrate 10, for example. Specifically, silicon carbide substrate 10 is heated at a temperature of more than or equal to 1300° C. and less than or equal to 1400° C., for example, in an atmosphere including oxygen. Thereby, first insulating film 3 in contact with fourth impurity region 14 at first main surface 1 is formed. Simultaneously with the formation of first insulating film 3, gate insulating film 34 (see FIG. 2) in contact with each of source region 29, body region 28, and drift region 27 is formed.

Figure 10:
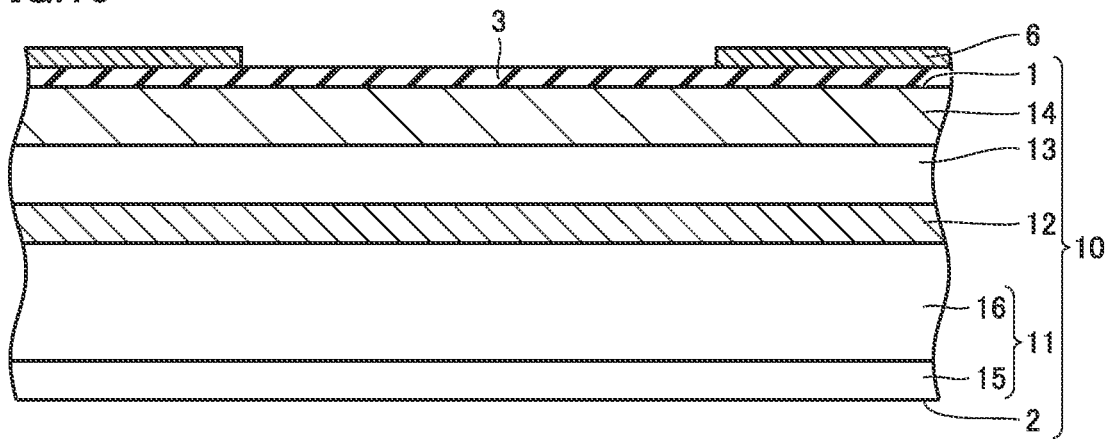
FIG. 10 is a schematic cross sectional view showing a fifth step of the method for manufacturing the silicon carbide semiconductor device in accordance with the present embodiment.

Then, the step of forming the gate connection portion and the gate electrode is performed. Gate connection portion 6 is formed on first insulating film 3 (see FIG. 10). Gate electrode 32 is formed on gate insulating film 34. Gate connection portion 6 and gate electrode 32 are formed by a low pressure chemical vapor deposition (LP-CVD) method, for example. Gate connection portion 6 and gate electrode 32 are made of polysilicon including a conductive impurity, for example. Gate electrode 32 is formed simultaneously with gate connection portion 6.

Then, the step of forming the first interlayer insulating film and the second interlayer insulating film is performed. First interlayer insulating film 4 and second interlayer insulating film 33 are formed by the CVD method, for example. First interlayer insulating film 4 and second interlayer insulating film 33 are made of a material including silicon dioxide, for example. Second interlayer insulating film 33 is formed in contact with each of first insulating film 3 and gate connection portion 6. Second interlayer insulating film 33 is formed to cover gate electrode 32.

Then, the step of forming the source electrode is performed. Each of second interlayer insulating film 33 and gate insulating film 34 is partially removed by etching to expose source region 29 and contact region 24. Then, source electrode 36 (see FIG. 2) in contact with source region 29 and contact region 24 at first main surface 1 is formed. Source electrode 36 is formed by a sputtering method, for example. Source electrode 36 is made of a material including Ti, Al, and Si, for example.

Then, alloying annealing is performed. Source electrode 36 in contact with source region 29 and contact region 24 is held at a temperature of more than or equal to 900° C. and less than or equal to 1100° C. for about 5 minutes, for example. Thereby, at least a portion of source electrode 36 reacts with silicon included in silicon carbide substrate 10, and is silicided. Thereby, source electrode 36 that forms an ohmic junction with source region 29 is formed. Source electrode 36 may form an ohmic junction with contact region 24. Then, source interconnection 35 is formed. Source interconnection 35 is made of a material including aluminum, for example. Source interconnection 35 is formed to be in contact with source electrode 36 and to cover second interlayer insulating film 33.

Then, the step of forming the drain electrode is performed. Drain electrode 40 in contact with second main surface 2 is formed by the sputtering method, for example. Drain electrode 40 is made of a material including NiSi or TiAlSi, for example. In this manner, MOSFET 100 (see FIGS. 1 and 2) in accordance with the present embodiment is completed.

It should be noted that, although it has been described in the above embodiment that n type is the first conductivity type and p type is the second conductivity type, p type may be the first conductivity type and n type may be the second conductivity type. In addition, although a planar-type MOSFET has been described as an example of silicon carbide semiconductor device 100 in the above embodiment, silicon carbide semiconductor device 100 may be a trench-type MOSFET having a gate trench, for example. In this case, when viewed from the direction perpendicular to first main surface 1, second impurity region 12 may be located between a bottom surface of the gate trench and second main surface 2. Second impurity region 12 may be a region that can alleviate the concentration of an electric field at the bottom surface of the gate trench.

The concentration of the p type impurity and the concentration of the n type impurity in each impurity region described above can be measured with a scanning capacitance microscope (SCM) or secondary ion mass spectrometry (SIMS), for example. In addition, the position of an interface between a p type region and an n type region (that is, an PN interface) can be specified with the SCM or SIMS, for example.

Next, the function and effect of silicon carbide semiconductor device 100 in accordance with the present embodiment will be described.

According to silicon carbide semiconductor device 100 in accordance with the present embodiment, each of first impurity region 11, second impurity region 12, third impurity region 13, and fourth impurity region 14 is located between gate pad 5 and drain electrode 40. Both second impurity region 12 and fourth impurity region 14 can block lines of electric force generated from drain electrode 40 toward gate pad 5. Thereby, the electrostatic capacitance between drain electrode 40 and gate pad 5 can be reduced. As a result, the switching characteristics of silicon carbide semiconductor device 100 can be improved.

In addition, silicon carbide semiconductor device 100 in accordance with the present embodiment further has source electrode 36 located on first main surface 1. Second impurity region 12 is electrically connected with source electrode 36. Thereby, the capacitance between gate pad 5 and drain electrode 40 is reduced, and thus charge to a parasitic capacitance is reduced at the time of turning on. As a result, the switching characteristics of silicon carbide semiconductor device 100 can be further improved.

Further, according to silicon carbide semiconductor device 100 in accordance with the present embodiment, when viewed from the direction perpendicular to first main surface 1, the area of second impurity region 12 may be more than or equal to the area of gate pad 5. Thereby, the electrostatic capacitance between drain electrode 40 and gate pad 5 can be reduced, when compared with a case where the area of second impurity region 12 is less than the area of gate pad 5. As a result, the switching characteristics of silicon carbide semiconductor device 100 can be improved.

Further, according to silicon carbide semiconductor device 100 in accordance with the present embodiment, when viewed from the direction perpendicular to first main surface 1, the area of fourth impurity region 14 may be more than or equal to the area of gate pad 5. Thereby, the electrostatic capacitance between drain electrode 40 and gate pad 5 can be reduced, when compared with a case where the area of fourth impurity region 14 is less than the area of gate pad 5. As a result, the switching characteristics of silicon carbide semiconductor device 100 can be improved.

It should be understood that the embodiment disclosed herein is illustrative and non-restrictive in every respect. The scope of the present invention is defined by the scope of the claims, rather than the above description, and is intended to include any modifications within the scope and meaning equivalent to the scope of the claims.

REFERENCE SIGNS LIST

1: first main surface; 2: second main surface; 3: first insulating film; 4: first interlayer insulating film; 5: gate pad; 6: gate connection portion; 7: through hole; 9: gate runner; 10: silicon carbide substrate; 11: first impurity region; 12: second impurity region; 13: third impurity region; 14: fourth impurity region; 15: silicon carbide single crystal substrate; 16: silicon carbide layer; 17: connection region; 21: embedded region; 23: second drift layer; 24: contact region; 26: first drift layer; 27: drift region; 28: body region; 29: source region; 32:

gate electrode; 33: second interlayer insulating film; 34: gate insulating film; 35: source interconnection; 36: source electrode; 40: drain electrode; 100: silicon carbide semiconductor device (MOSFET); 101: first direction; 102: second direction.

The invention claimed is:

1. A silicon carbide semiconductor device comprising:
a silicon carbide substrate having a first main surface and a second main surface opposite to the first main surface;
a gate pad facing the first main surface; and
a drain electrode in contact with the second main surface,
the silicon carbide substrate including
a first impurity region constituting the second main surface and having a first conductivity type,
a second impurity region provided on the first impurity region and having a second conductivity type different from the first conductivity type,
a third impurity region provided on the second impurity region and having the first conductivity type, and
a fourth impurity region provided on the third impurity region, constituting the first main surface, and having the second conductivity type,
each of the first impurity region, the second impurity region, the third impurity region, and the fourth impurity region being located between the gate pad and the drain electrode,
when viewed from a direction perpendicular to the first main surface, an outer edge of the second impurity region surrounds an outer edge of the gate pad.

2. The silicon carbide semiconductor device according to claim 1, further comprising a source electrode located on the first main surface, wherein
the second impurity region is electrically connected with the source electrode.

3. The silicon carbide semiconductor device according to claim 1, wherein the second impurity region has an impurity concentration of more than or equal to $1\times10^{17}$ cm$^{-3}$ and less than or equal to $1\times10^{20}$ cm$^{-3}$.

4. The silicon carbide semiconductor device according to claim 1, wherein the second impurity region has a thickness of more than or equal to 100 nm and less than or equal to 2 µm.

5. The silicon carbide semiconductor device according to claim 1, wherein the fourth impurity region has an impurity concentration of more than or equal to $1\times10^{16}$ cm$^{-3}$ and less than or equal to $1\times10^{20}$ cm$^{-3}$.

6. The silicon carbide semiconductor device according to claim 1, wherein the fourth impurity region has a thickness of more than or equal to 100 nm and less than or equal to 2 µm.

7. The silicon carbide semiconductor device according to claim 1, wherein, when viewed from a direction perpendicular to the first main surface, an area of the second impurity region is more than or equal to an area of the gate pad.

8. The silicon carbide semiconductor device according to claim 1, wherein, when viewed from a direction perpendicular to the first main surface, an area of the fourth impurity region is more than or equal to an area of the gate pad.

9. A silicon carbide semiconductor device comprising:
a silicon carbide substrate having a first main surface and a second main surface opposite to the first main surface;
a gate pad facing the first main surface;
a drain electrode in contact with the second main surface; and
a source electrode located on the first main surface,
the silicon carbide substrate including
a first impurity region constituting the second main surface and having a first conductivity type,
a second impurity region provided on the first impurity region and having a second conductivity type different from the first conductivity type,
a third impurity region provided on the second impurity region and having the first conductivity type, and
a fourth impurity region provided on the third impurity region, constituting the first main surface, and having the second conductivity type,
each of the first impurity region, the second impurity region, the third impurity region, and the fourth impurity region being located between the gate pad and the drain electrode,
the second impurity region being electrically connected with the source electrode,
when viewed from a direction perpendicular to the first main surface, an area of each of the second impurity region and the fourth impurity region being more than or equal to an area of the gate pad,
when viewed from a direction perpendicular to the first main surface, an outer edge of the second impurity region surrounds an outer edge of the gate pad.

10. The silicon carbide semiconductor device according to claim 9, wherein the second impurity region has an impurity concentration of more than or equal to $1\times10^{17}$ cm$^{-3}$ and less than or equal to $1\times10^{20}$ cm$^{-3}$.

11. The silicon carbide semiconductor device according to claim 9, wherein the second impurity region has a thickness of more than or equal to 100 nm and less than or equal to 2 µm.

12. The silicon carbide semiconductor device according to claim 9, wherein the fourth impurity region has an impurity concentration of more than or equal to $1\times10^{16}$ cm$^{-3}$ and less than or equal to $1\times10^{20}$ cm$^{-3}$.

13. The silicon carbide semiconductor device according to claim 9, wherein the fourth impurity region has a thickness of more than or equal to 100 nm and less than or equal to 2 µm.

* * * * *